United States Patent [19]

Furukawa

[11] Patent Number: 5,526,176
[45] Date of Patent: Jun. 11, 1996

[54] SEMICONDUCTOR OPTICAL AMPLIFIER WHICH FUNCTIONS INDEPENDENTLY OF POLARIZATION AND AN OPTICAL COMMUNICATION SYSTEM USING THE SAME

[75] Inventor: Yukio Furukawa, Atsugi, Japan

[73] Assignee: Canon Kabushiki Kaisha, Tokyo, Japan

[21] Appl. No.: 203,355

[22] Filed: Mar. 1, 1994

[30] Foreign Application Priority Data

Mar. 9, 1993 [JP] Japan ................... 5-075352

[51] Int. Cl.$^6$ ................... H01S 3/00; H04B 10/00
[52] U.S. Cl. ................... 359/344; 359/154; 359/160
[58] Field of Search ................... 359/337, 344, 359/156, 154, 160

[56] References Cited

U.S. PATENT DOCUMENTS

| 5,198,921 | 3/1993 | Aoshima et al. | 359/248 |
| 5,223,972 | 6/1993 | Nishimura et al. | 359/337 |
| 5,388,117 | 2/1995 | Nishimura | 372/45 |

FOREIGN PATENT DOCUMENTS

| 0470523 | 2/1992 | European Pat. Off. |
| 2235449 | 12/1990 | Japan . |
| 3184388 | 11/1991 | Japan . |
| 5090703 | 8/1993 | Japan . |

OTHER PUBLICATIONS

IEEE Photonics Technology Letters, vol. 3, No. 4, pp. 320–323, E. R. Ranalli, et al., "Narrow bandwidth electrooptic polarization modulator using GaAs Quantum well waveguides." (Apr./1991).

Transactions Of The Institute Of Electronics And Communication Engineers Of Japan, Section E, vol. E71, No. 5, pp. 482–484, T. Saitoh, et al., "Structural design of polarization insensitive 1.55 travelling wave semiconductor laser amplifiers." (May/1988).

*Primary Examiner*—Mark Hellner
*Attorney, Agent, or Firm*—Fitzpatrick, Cella, Harper & Scinto

[57] ABSTRACT

A polarization independent optical amplifying apparatus of the present invention imparts a gain to a received input light signal. The optical amplifying apparatus includes a substrate and a plurality of semiconductor layers formed on the substrate. The semiconductor layers include at least one semiconductor layer having a TE-TM conversion function. A relation of $L=2n\pi[4\kappa^2-(g_{TE}-g_{TM})^2]^{1/2}$ is satisfied where L is a propagation length, n is a natural number, $\kappa$ is a coupling coefficient between TE mode light and TM mode light, $g_{TE}$ is a gain coefficient of the TE mode light and $g_{TM}$ is a gain coefficient of the TM mode light. The TE mode-TM mode conversion function may be caused by one of a magneto-optic effect, an electro-optic effect and an acousto-optic effect.

13 Claims, 2 Drawing Sheets

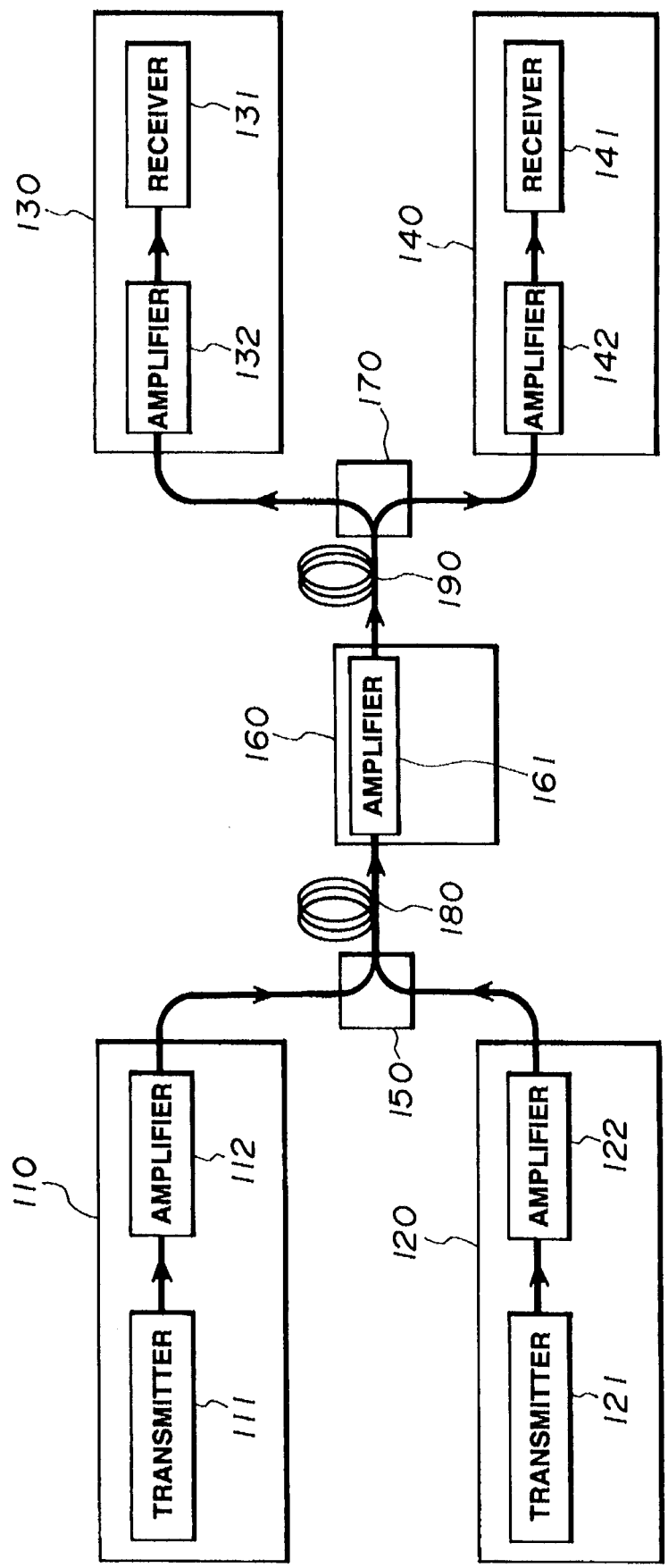

SEMICONDUCTOR OPTICAL AMPLIFIER WHICH FUNCTIONS INDEPENDENTLY OF POLARIZATION AND AN OPTICAL COMMUNICATION SYSTEM USING THE SAME

BACKGROUND OF THE INVENTION

1. Field of the Invention

The present invention relates to a polarization independent semiconductor optical amplifier or amplifying apparatus for amplifying a light signal or the like that is transmitted in an optical communication, and an optical communication system or network using the optical amplifier.

2. Related Background Art

An optical amplifier or amplifying apparatus for amplifying a light signal without using any opto-electric and/or electro-optic conversions is widely used in optical communication systems. Such an optical amplifier is a key device which is indispensable for the prolongation of relay distances for an optical transmission.

As a means for attaining an optical amplifier, a method of utilizing nonlinear scattering in an optical fiber, such as the Raman or the Brillouin effect, can be used. However, a traveling wave type optical amplifier, which uses the gain function of a semiconductor laser (LD), has been widely studied since it has the advatages of being compact, using a small amount of electric power, having structural simplicity and so forth. The traveling wave type optical amplifier can be expected to have characteristics such as its wavelength band of gain range being wide and that it can obtain a stable state of operation, regardless of variations in temperature.

Generally, a traveling wave type optical amplifier has a structure in which antireflection films are respectively formed on opposite end surfaces of a buried-structure laser diode (LD) and its active layer has typically a thickness of 0.1 μm and a width of 2 μm. As a result, the gain of such a traveling wave type optical amplifier is largely dependent on polarization due to its asymmetry in thickness and the width of the active layer. Thus, an optical amplifier of this type exhibits a difference in gain of several decibels for light components having different polarization states.

The polarization state of a light signal that is propagated through an optical fiber would be fluctuating. Therefore, an error is caused at the time of signal receiving if the gain of an optical amplifier is strongly dependent on polarization, as discussed above. In general, although the waveguide structure of an active layer only has to be equalized (its thickness is increased and its width is narrowed) in order to reduce the dependency of gain on polarization for incident light, the thickness and width need to be set below 0.5 μm×0.5 μm to keep a single mode condition. However, it is difficult to achieve such a size using present technologies.

SUMMARY OF THE INVENTION

The object of the present invention is to provide, in view of the above problem, a polarization independent semiconductor optical amplifier or amplifying apparatus whose gain is free from polarization dependency, and an optical communication system using this optical amplifying apparatus.

In the optical amplifying apparatus of this invention, to achieve the above object, there are provided a plurality of semiconductor layers which includes at least one semiconductor layer having a TE (transverse electric) mode-TM (transverse magnetic) mode conversion function. The TE mode-TM mode conversion function is attained by utilizing one of a magneto-optic effect, an electro-optic effect or an acousto-optic effect.

The present invention provides a polarization independent optical amplifying apparatus for imparting a gain to an input light signal, the apparatus comprising a substrate, and a plurality of semiconductor layers, which receive the input light signal and impart the gain thereto, the plurality of semiconductor layers being formed on the substrate and including at least one semiconductor layer having a TE mode-TM mode conversion function for making the gain independent of any influences from a change in polarization of the input light signal.

In the optical communication system of this invention to achieve the above object, there are provided a transmitter station for transmitting a light signal; a receiver station for receiving the light signal; a transmission line, upon which the light signal travels, for connecting the transmitter station and the receiver station; and an optical amplifying apparatus disposed in at least one location of the transmitter station and the receiver station and the transmission line. The optical amplifying apparatus is constructed as mentioned immediately above.

The operation principle of the present invention will be described using a mode-coupling theory.

If complex amplitudes of TE mode light and TM mode light, propagating in a light waveguide, are respectively $A_{TE}(z)$ and $A_{TM}(z)$, then $A_{TE}(z)$ and $A_{TM}(z)$ are not independent from each other, and only functions of z in their coupling equations along a z-axis are related to each other when a coupling exists between the TE mode light and TM mode light. Such a relation can be given by:

$$dA_{TE}(z)/dz = -j\kappa A_{TM}(z) + g_{TE} A_{TE}(z) \tag{1a}$$

$$dA_{TM}(z)/dz = -j\kappa A_{TE}(z) + g_{TM} A_{TM}(z) \tag{1b}$$

where κ is the coupling coefficient between the TE mode light and the TM mode light, $g_{TE}$ is the gain coefficient of the TE mode light and $g_{TM}$ is the gain coefficient of the TM mode light. In general, in the case of a semiconductor optical amplifier, a relation of $g_{TE} > g_{TM}$ is true because the gain coefficient of the TE mode light is larger than the gain coefficient of the TM mode light.

Then, in order to solve equations (1a) and (1b), the following formulae are assumed:

$$A_{TE}(z) = \tilde{A}_{TE} exp(-j\gamma z) \tag{2a}$$

$$A_{TM}(z) = \tilde{A}_{TM} exp(-j\gamma z) \tag{2b}$$

Then, the relations (2a) and (2b) are substituted into the equations (1a) and (1b), so that a quadratic equation for γ and relation (4) are obtained as follows:

$$\gamma = \{j(g_{TE}+g_{TM}) \pm [4\kappa^2 - (g_{TE}-g_{TM})^2]^{1/2}\}/2 \equiv \gamma_\pm \tag{3}$$

$$\tilde{A}_{TM} = (g_{TE}+j\gamma)/j\kappa \cdot \tilde{A}_{TE} \tag{4}$$

Hence, by using the relations (2a), (2b), (3), and (4), the solutions can be represented by:

$$A_{TE}(z) = \tilde{A}_{TE+} exp(-j\gamma_+ z) + \tilde{A}_{TE-} exp(-j\gamma_- z) \tag{5a}$$

$$A_{TM}(z) = \tilde{A}_{TM+} exp(-j\gamma_+ z) + \tilde{A}_{TM-} exp(-j\gamma_- z) \tag{5b}$$

$$A_{TM\pm}=(g_{TE}+j\gamma_\pm)/j\kappa \cdot A_{TE\pm} \quad (6)$$

Further, if the following relations (7a) and (7b) are true, irrespective of the values of $A_{TE}(0)$ and $A_{TM}(0)$, when the TE mode light and TM mode light are propagated by a given propagation length L, a polarization independent optical amplifier having a total gain G can be constituted:

$$A_{TE}(L)=GA_{TE}(0) \quad (7a)$$

$$A_{TM}(L)=GA_{TM}(0) \quad (7b)$$

That is, as is known from the the formulae (5a), (5b), (6), (7a) and (7b), the relations (7a) and (7b) are satisfied when the following relation holds true:

$$L=2n\pi/[4\kappa^2-(g_{TE}-g_{TM})^2]^{1/2} \quad (8)$$

The total gain G is given by:

$$G=\pm exp[(g_{TE}+g_{TM})/2 \cdot L] \quad (9)$$

where n=2m in the case of + (plus) and n=2m+1 in the case of − (minus).

In a word, a polarization independent semiconductor optical amplifier can be built by imparting a TE-TM conversion function to an optical amplifier and adjusting the TE-TM coupling coefficient κ, gain coefficients $g_{TE}$ and $g_{TM}$ and propagation length L so that relation (8) is satisfied.

These advantages and others will be more readily understood in connection with the following detailed description of the preferred embodiments in conjunction with the drawings.

BRIEF DESCRIPTION OF THE DRAWINGS

FIG. 2 is a schematic diagram of an optical communication system using the semiconductor optical amplifier of the present invention.

DESCRIPTION OF THE PREFERRED EMBODIMENT

First Embodiment

Figure 1:
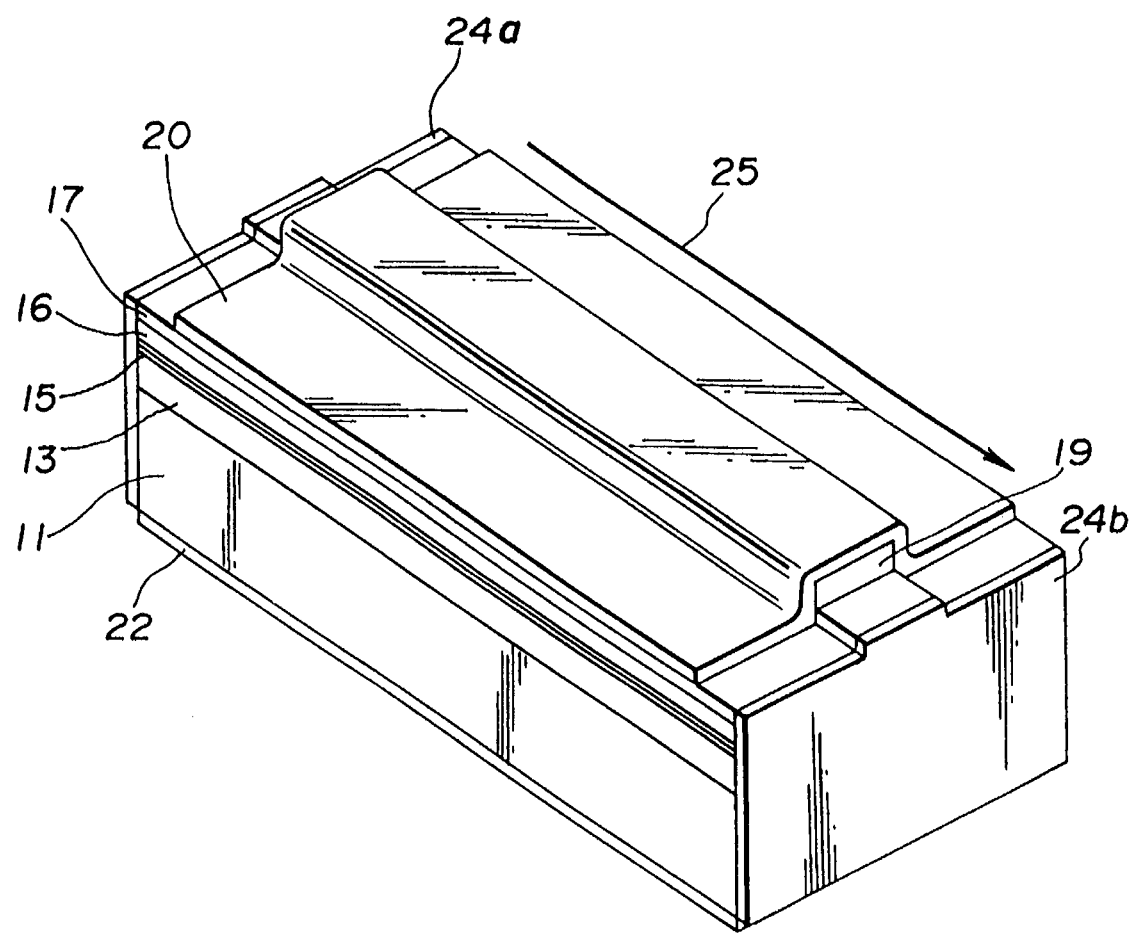
FIG. 1 a perspective view of a first embodiment of a semiconductor optical amplifier of the present invention.

FIG. 1 illustrates a first embodiment of a semiconductor optical amplifier according to the present invention. Use is made of CdMnTe, which is a material having a magneto-optic effect, in the first embodiment.

In the first embodiment, on an In-doped n-CdTe substrate 11, an In-doped n-$Cd_{0.7}Mn_{0.3}Te$ cladding layer 13 whose thickness is 1 μm, a φ-GaAs/$Al_{0.3}Ga_{0.7}As$ superlattice active layer 15 whose thickness is 0.1 μm, a Be-doped p-$Al_{0.3}Ga_{0.7}As$ light waveguide layer 16 whose thickness is 0.2 μm, an As-doped p-$Cd_{0.7}Mn_{0.3}Te$ cladding layer 17 whose thickness is 1 μm and an As-doped p-CdTe cap layer 19 are consecutively layered in this order, using an epitaxial layering method.

Next, as shown in FIG. 1, the cladding layer 17 and the cap layer 19 are shaped into a ridge configuration to build a channel waveguide. Then, a p-type electrode 20 of Cr/Au and an n-type electrode 22 of AuGe/Ni/Au are formed on predetermined locations.

The thus formed wafer is cleaved or cut to a predetermined size. Finally, antireflection coatings 24a and 24b of $SiO_x$, having a predetermined thickness, are provided on both facets of the device.

In the thus fabricated semiconductor optical amplifier, the injection current is set at 65 mA and a magnetic field H of 15 kOe is applied in a light propagation direction, as shown by the arrow 25 in FIG. 1. Then, values of the gain coefficient for TE mode light $g_{TE}$=59 [$cm^{-1}$], the gain coefficient for TM mode light $g_{TM}$=41 [$cm^{-1}$] and the TE-TM coupling coefficient κ=34 [rad/cm] are obtained. Therefore, as is known from relation (8), if the propagation length is set at 0.96 mm or 960 μm, then a semiconductor optical amplifier, which has a gain that is independent from the polarization state of incident light, can be manufactured. The gain amounts to 42 dB, as is seen from relation (9).

Furthermore, it is possible to satisfy relation (8) by adjusting the injection current and the applied magnetic field based on the actual propagation length L of the cleaved device.

While the magneto-optic effect is utilized in the above embodiment, other embodiments may be possible if the TE-TM conversion function can be attained. For example, it is possible to realize the TE-TM conversion function by using material having an electro-optic effect or an acousto-optic effect.

Further, while the CdTe substrate 11 and AlGaAs active layer 15 are used, and a device having a wavelength of 0.8 μm is exemplified in the above embodiment, the material series that can be used is not limited thereto. Other material, such as an InP series and the like, may be used. For example, when InP is used, $Y_3Fe_5O_{12}$ (YIG) may be used as a material having the magneto-optic effect. Furthermore, GaAs may be used as a substrate.

Although $SiO_x$ is used as the antireflection coatings 24a and 24b, other materials, such as $Al_2O_3$, $TiO_2$, $ZrO_2$, $CeO_2$ and a multi-layered version thereof, may be used. In addition, a buried-type structure or the like may be used instead of the ridge-type structure.

Second Embodiment

Since the semiconductor optical amplifier of the present invention has the characteristic of polarization independence, its advantageous effect can be highly utilized when it is used in an optical communication system. An example of an N-to-N optical communication system using the semiconductor optical amplifier of the present invention will be described.

FIG. 2 shows such an optical communication system in which the above optical amplifying apparatus is used. In FIG. 2, reference numerals 110 and 120 are transmitter stations, reference numerals 150 and 170 are branching-combining devices, reference numeral 160 is a relay station, reference numerals 130 and 140 are receiver stations, and reference numerals 180 and 190 are optical transmission lines. The transmitter stations 110 and 120 respectively include both light transmitters 111 and 121, which are provided with a signal processing portion or processor and an electro-optical converting portion or transducer, and optical amplifying devices or amplifiers 112 and 122 for amplifying a light signal that is output from the light transmitters 111 and 121, respectively. The relay station 160 includes an amplifier 161. The receiver stations 130 and 140 respectively include both optical amplifying devices or amplifiers 132 and 142, for amplifying an input light signal, and light receivers 131 and 141, which include an optoelectric transducer and a signal processing portion.

In the optical communication system of FIG. 2, light signals output from the light transmitters 111 and 121 are amplified by the amplifying devices 112 and 122, respectively, and are output from the transmitter stations 110 and 120, respectively. The output signals are controlled, so that they do not collide with each other on the transmission line 180, by using a prescribed multiplexing system, such as time division multiplexing, frequency division multiplexing, CSMA/CD (carrier sense multiple access/collision detection), etc., and they are sent to the transmission line 180 through the branching-combining device 150. When the light signal is transmitted in the transmission line 180, the light is attenuated, so that the light signal is amplified by the relay station 160. In FIG. 2, only one relay station 160 is disposed, but if necessary, the relay station 160 may be disposed at a plurality of locations. On the other hand, no relay station need be used, if it is deemed unnecessary.

The light signal amplified by the relay station 160 is input into the branching-combining device 170 through the light transmission line 190 and is separated by such a separation method as corresponds to the multiplexing system that is used. Then the separated light signals are each input into their respective receiver stations 130 and 140. The light signal input to each receiver station 130 and 140 is amplified by the optical amplifiers 132 and 142, to compensate for losses generated in the light transmission line 190 and the branching-combining device 170, and is then input into the light receivers 131 and 141, respectively. Thus, communications from the transmitter station 110 to the receiver station 130 and from the transmitter station 120 to the receiver station 140 are conducted through serially connected single light transmission lines 180 and 190.

In FIG. 2, there are two transmitter stations and two receiver stations, but the branch number of the branching-combining devices 150 and 170 may be increased to attain an N-to-N communication by using N number of transmitter stations and N number of receiver stations. Further, one-to-one communication is also possible without using the branching-combining devices 150 and 170. In FIG. 2, there is no need to position the optical amplifying apparatus in all of the illustrated locations. This apparatus only needs to be disposed in locations where the signal attenuation at each part should be compensated for.

When the polarization independent optical amplifying apparatus is used in the optical communication system as shown in FIG. 2, the light receiver in the system will not be influenced with adverse changes in the dynamic range and the like because, even if the amplifying apparatus receives a light signal that is unstable in its state of polarization, the output therefrom is always supplied as a signal that is amplified to a constant level.

In the optical communication system, an optical fiber is generally used as a light transmission line. Although the polarization state fluctuates at the output portion of an ordinary optical fiber due to a change in temperature or a bending of the optical fiber, the optical communication system can be stably operated, irrespective of fluctuations in the polarization state, because the semiconductor optical amplifier of the present invention can amplify a light signal independent of its polarization state.

As described in the foregoing, according to the present invention, a so-called polarization independent optical amplifying apparatus, in which its amplification gain would not vary, even if the polarization state of an input light changes, can be attained by using material having a TE-TM conversion function in a portion of its waveguide. By using such a polarization independent optical amplifying apparatus, an optical communication network or system that has a communication quality which is excellent, and where there is no limit to its size and where its system structure is relatively simple, can be realized.

Except as otherwise disclosed herein, the various components shown in outline or block form in the Figures are individually well known in the optical amplifying apparatus arts or amplifiers and optical communication systems arts, and their internal construction and operation are not critical either to the making or using of this invention or to a description of the best mode of the invention.

While the present invention has been described with respect to what is presently considered to be the preferred embodiments, it is to be understood that the invention is not limited to the disclosed embodiments. The present invention is intended to cover various modifications and equivalent arrangements included within the sprit and scope of the appended claims.

What is claimed is:

1. An optical amplifying apparatus having reduced dependency on polarization for imparting a gain to an input light signal, said apparatus comprising:

a substrate; and a plurality of semiconductor layers, which receive the input light signal and impart the gain thereto, said plurality of semiconductor layers being formed on said substrate and including at least one semiconductor layer having a TE mode-TM mode conversion function for reducing the dependency of the gain on polarization of the input light signal.

2. An optical amplifying apparatus having reduced dependency on polarization according to claim 1, wherein a relation of $L=2n\pi/[4\kappa^2-(g_{TE}-g_{TM})^2]1/2$ is satisfied where L is a propagation length, n is a natural number, $\kappa$ is a coupling coefficient between TE mode light and TM mode light, $g_{TE}$ is a gain coefficient of the TE mode light and $g_{TM}$ is a gain coefficient of the TM mode light.

3. An optical amplifying apparatus having reduced dependency on polarization according to claim 1, wherein the TE mode-TM mode conversion function is caused by one of a magneto-optic effect, an electro-optic effect and acousto-optic effect.

4. An optical amplifying apparatus having reduced dependency on polarization according to claim 1, wherein said substrate comprises a CdTe substrate.

5. An optical amplifying apparatus having reduced dependency on polarization according to claim 1, wherein at least one semiconductor layer having the TE mode-TM mode conversion function comprises a CdMnTe layer.

6. An optical amplifying apparatus having reduced dependency on polarization according to claim 1, wherein at least one semiconductor layer having the TE mode-TM mode conversion function comprises a $Y_3Fe_5O_{12}$ (YIG) layer.

7. An optical amplifying apparatus having reduced dependency on polarization according to claim 1, wherein the optical amplifying apparatus has a facet on each of its lengthwise ends, and further comprises antireflection films provided on both of the facets.

8. An optical amplifying apparatus having reduced dependency on polarization according to claim 7, wherein said antireflection films respectively comprise one of $SiO_x$, $Al_2O_3$, $TiO_2$, $ZrO_2$, $CeO_2$ and multi-layered versions thereof.

9. An optical communication system comprising:

a transmitter station for transmitting a light signal;

a receiver station for receiving the light signal;

a transmission line, upon which the light signal travels, for connecting said transmitter station and said receiver station; and an optical amplifying apparatus, for imparting a gain to the light signal, disposed in at least one location of said transmitter station, said receiver station and said transmission line, said optical amplifying apparatus comprising (i) a substrate and (ii) a plurality of semiconductor layers, which receive the input light signal and impart the gain thereto, said plurality of semiconductor layers being formed on said substrate and including at least one semiconductor layer having a TE mode-TM mode conversion function for reducing the dependency of the gain on polarization of the input light signal.

10. An optical communication system according to claim 9, wherein a relation of $L=2n\pi/[4\ \kappa^2-(g_{TE}-g_{TM})^2]^{1/2}$ is satisfied where L is a propagation length, n is a natural number, $\kappa$ is a coupling coefficient between TE mode light and TM mode light, $g_{TE}$ is a gain coefficient of the TE mode light and $g_{TM}$ is a gain coefficient of the TM mode light.

11. An optical communication system according to claim 9, wherein the TE mode-TM mode conversion function is caused by one of a magneto-optic effect, an electro-optic effect and an acousto-optic effect.

12. An optical amplifying apparatus having reduced dependency on polarization according to claim 1, wherein said substrate comprises an InP substrate.

13. An optical amplifying apparatus having reduced dependency on polarization according to claim 1, wherein said substrate comprises a GaAs substrate.

* * * * *

UNITED STATES PATENT AND TRADEMARK OFFICE
CERTIFICATE OF CORRECTION

PATENT NO. : 5,526,176
DATED : June 11, 1996
INVENTOR(S) : Furukawa

It is certified that error appears in the above-indentified patent and that said Letters Patent is hereby corrected as shown below:

COLUMN 2:

Line 58, "$\gamma=\}j(g_{TE}-g_{TM}) \pm [4\kappa^2-(g_{TE}-g_{TM})^2]^{\frac{1}{2}}\}/2 \equiv \gamma_{\pm}$  (3)" should read --$\gamma=\{j(g_{TE}+g_{TM}) \pm [4\kappa^2-(g_{TE}-g_{TM})^2]^{\frac{1}{2}}\}/2 \equiv \gamma_{\pm}$  (3)--.

COLUMN 6:

Line 19, "sprit" should read --spirit--; and
Line 36, "$L=2n\pi/[4\kappa^2-(g_{TE}-g_{TM})^2]1/2$" should read --$L=2n\pi/[4\kappa^2-(g_{TE}-g_{TM})^2]^{\frac{1}{2}}$--.

Signed and Sealed this

First Day of October, 1996

Attest:

BRUCE LEHMAN

Attesting Officer  Commissioner of Patents and Trademarks